US006532172B2

(12) United States Patent
Harari et al.

(10) Patent No.: US 6,532,172 B2
(45) Date of Patent: Mar. 11, 2003

(54) STEERING GATE AND BIT LINE SEGMENTATION IN NON-VOLATILE MEMORIES

(75) Inventors: Eliyahou Harari, Los Gatos, CA (US); George Samachisa, San Jose, CA (US); Daniel C. Guterman, Fremont, CA (US); Jack H. Yuan, Cupertino, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 09/871,333

(22) Filed: May 31, 2001

(65) Prior Publication Data

US 2002/0181266 A1 Dec. 5, 2002

(51) Int. Cl.[7] .............................................. G11C 16/04
(52) U.S. Cl. ..................................... 365/185.14; 365/63
(58) Field of Search ..................... 365/185.14, 185.11, 365/185.29, 63, 51; 257/316, 318, 319

(56) References Cited

U.S. PATENT DOCUMENTS

| 5,095,344 A | 3/1992 | Harari .................... 365/185.22 |
| 5,313,421 A | 5/1994 | Guterman et al. .......... 365/185 |
| 5,315,541 A | 5/1994 | Harari et al. ................ 365/63 |
| 5,343,063 A | 8/1994 | Yuan et al. ................. 257/317 |
| 5,579,259 A | 11/1996 | Samachisa et al. .... 365/230.08 |
| 5,661,053 A | 8/1997 | Yuan ........................... 999/43 |
| 5,712,180 A | 1/1998 | Guterman et al. ............. 999/43 |
| 5,963,465 A | 10/1999 | Eitan ........................... 365/63 |
| 6,002,152 A | * 12/1999 | Guterman et al. .......... 257/316 |
| 6,091,633 A | 7/2000 | Cernea et al. .......... 365/185.13 |
| 6,103,573 A | 8/2000 | Harari et al. ................ 438/257 |
| 6,151,248 A | 11/2000 | Harari et al. ........... 365/185.14 |
| 6,222,762 B1 | 4/2001 | Guternam et al. ...... 365/185.03 |

OTHER PUBLICATIONS

International Search Report for corresponding PCT application No. PCT/US02/09535 dated Apr. 10, 2002.

* cited by examiner

Primary Examiner—Vu A. Le
(74) Attorney, Agent, or Firm—Skjerven Morrill LLP

(57) ABSTRACT

Steering and bit lines (of a flash EEPROM system, for example) are segmented along columns of a memory cell array. In one embodiment, the steering and bit lines of one of their segments are connected at a time to respective global steering and bit lines. The number of rows of memory cells included in individual steering gate segments is a multiple of the number of rows included in individual bit line segments in order to have fewer steering gate segments. This saves considerable circuit area by reducing the number of segment selecting transistors necessary for the steering gates, since these transistors must be larger than those used to select bit line segments in order to handle higher voltages. In another embodiment, local steering gate line segments are combined in order to reduce their number, and the reduced number of each segment is then connected directly with an address decoder, without the necessity of a multiplicity of large switching transistors outside of the decoder to select the segment.

15 Claims, 6 Drawing Sheets

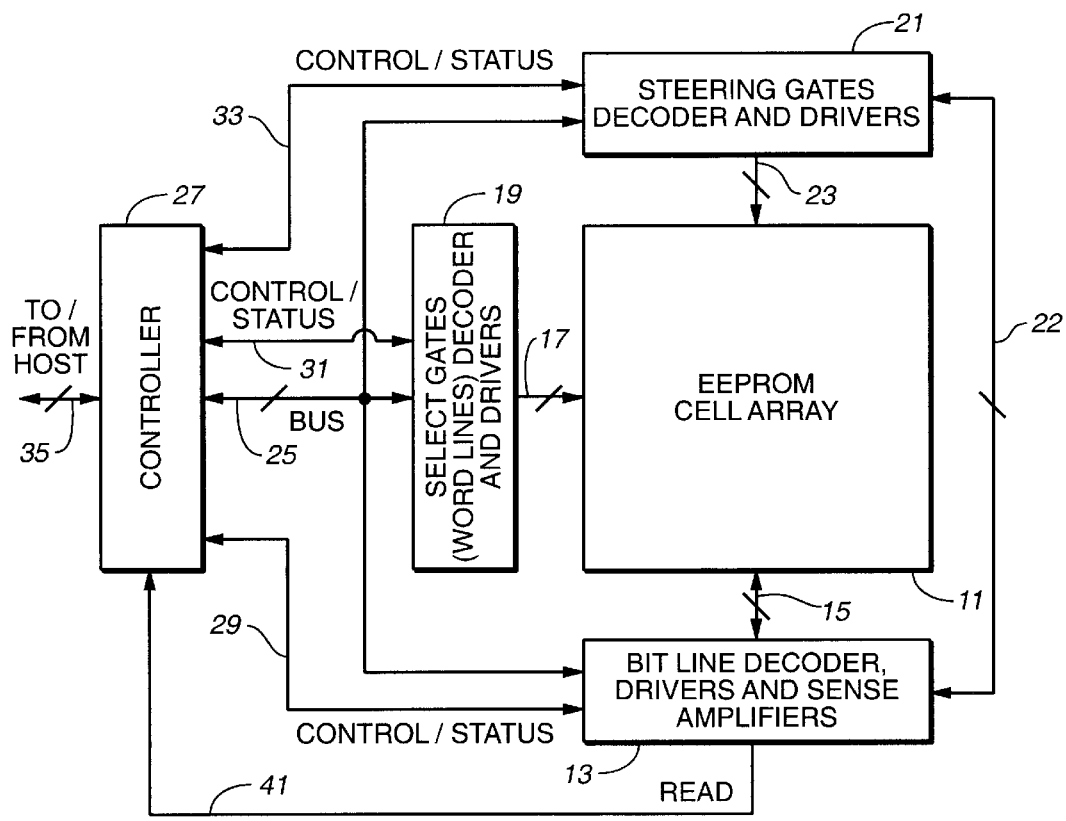
FIG._1
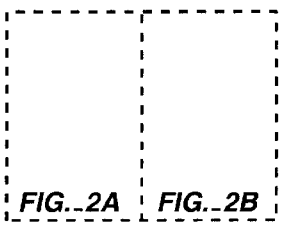
FIG._2

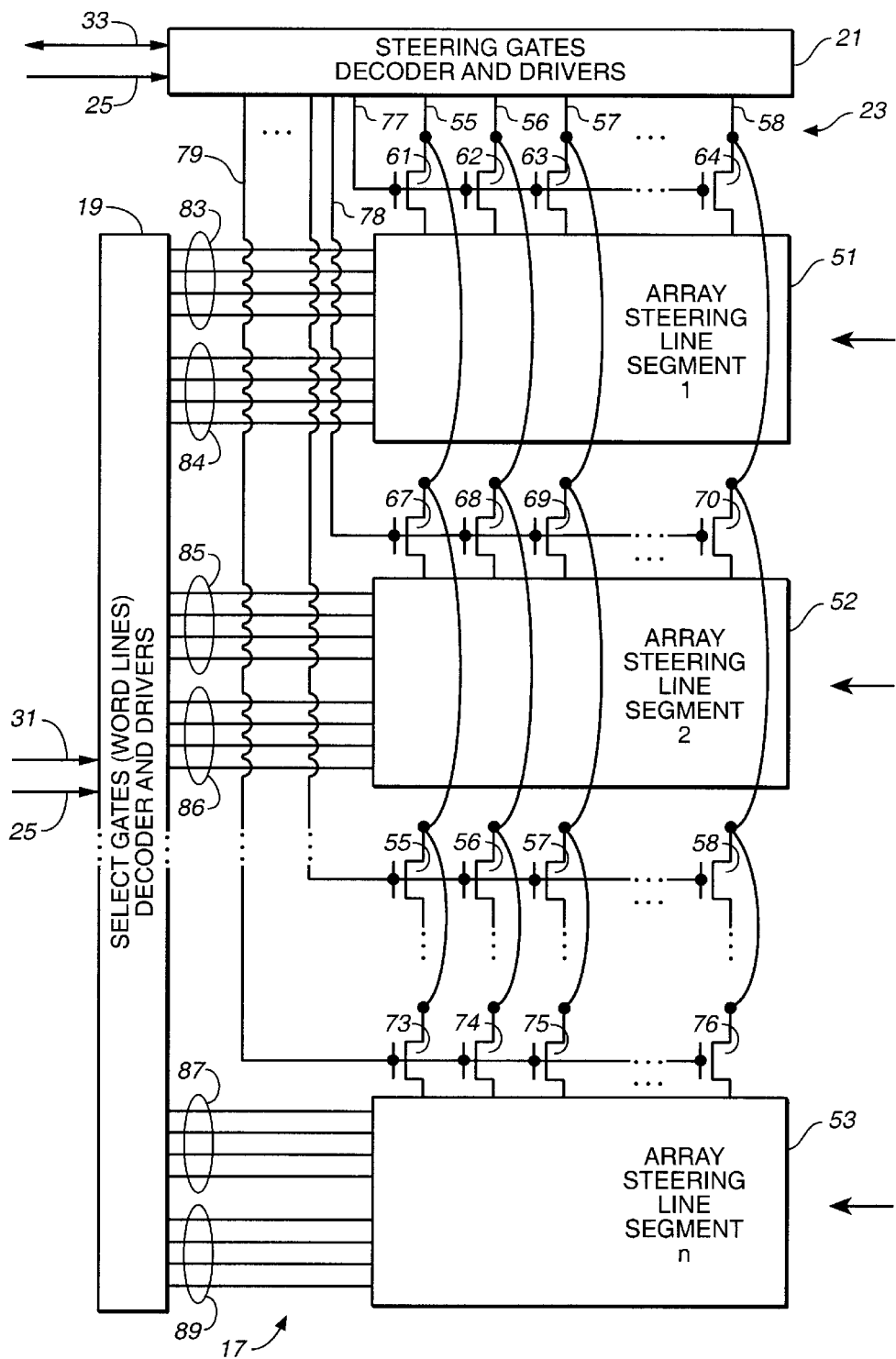
FIG._2A

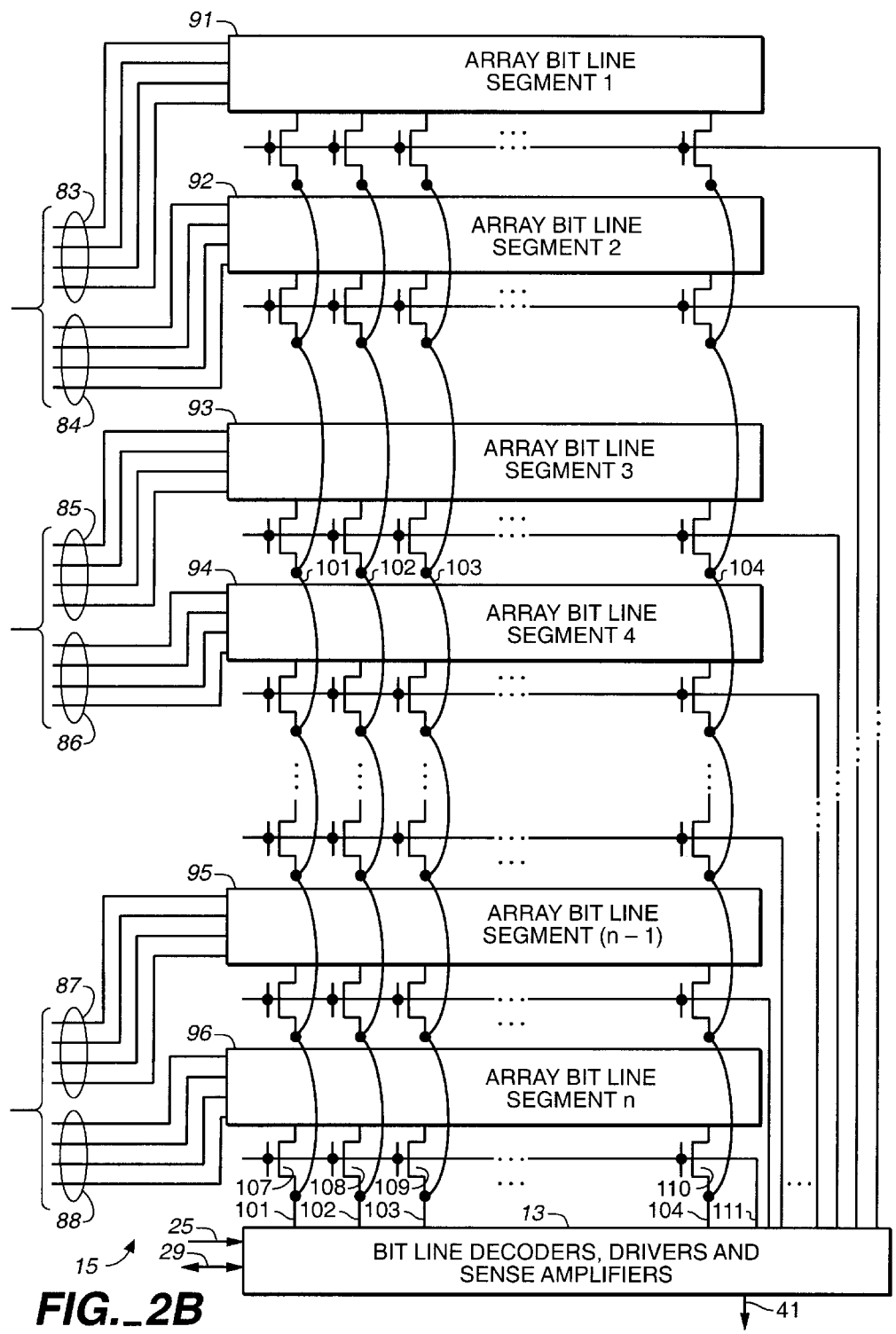
FIG._2B

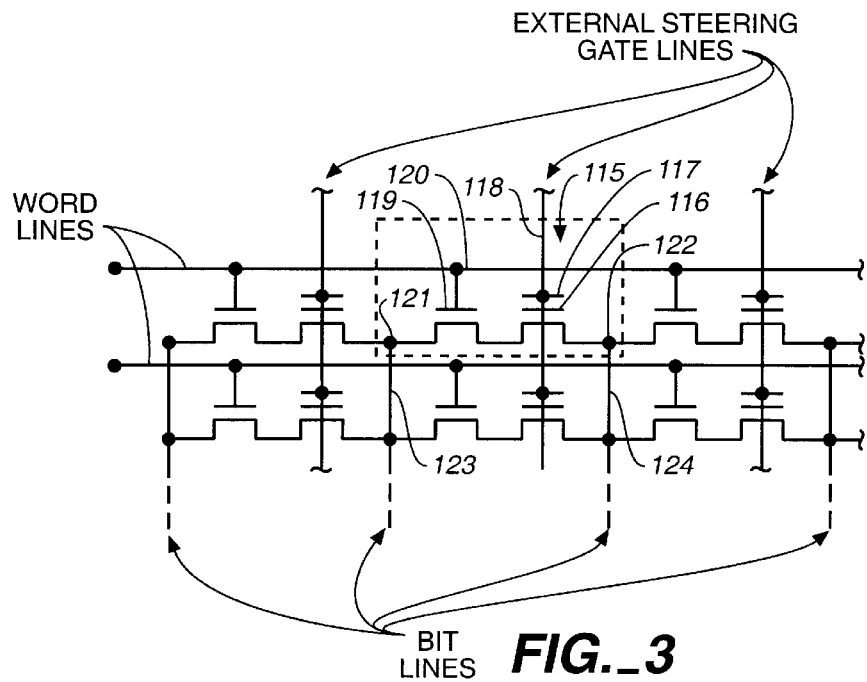
FIG._3
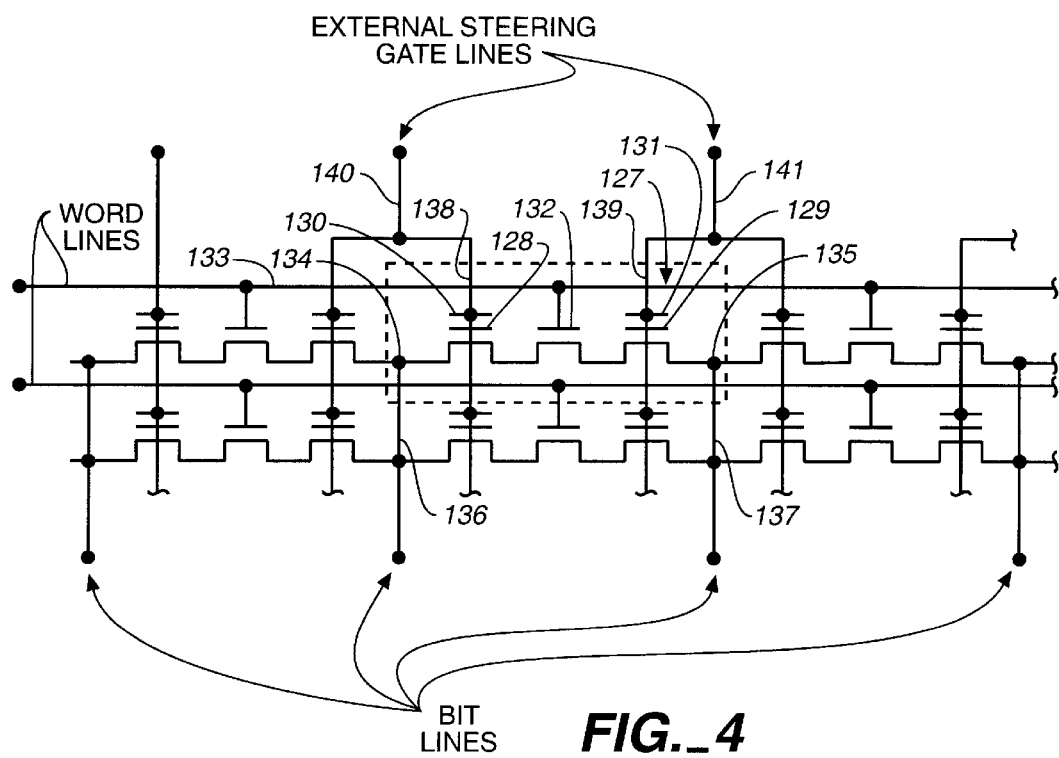
FIG._4

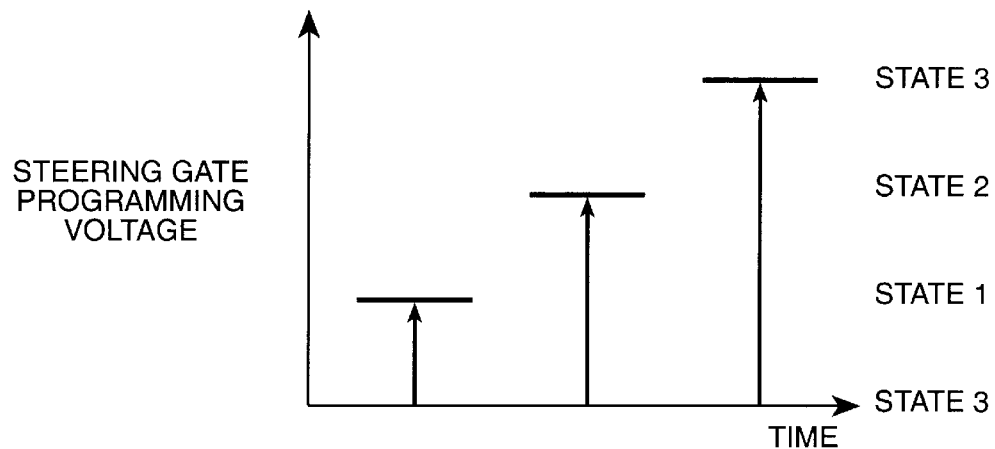
FIG._5
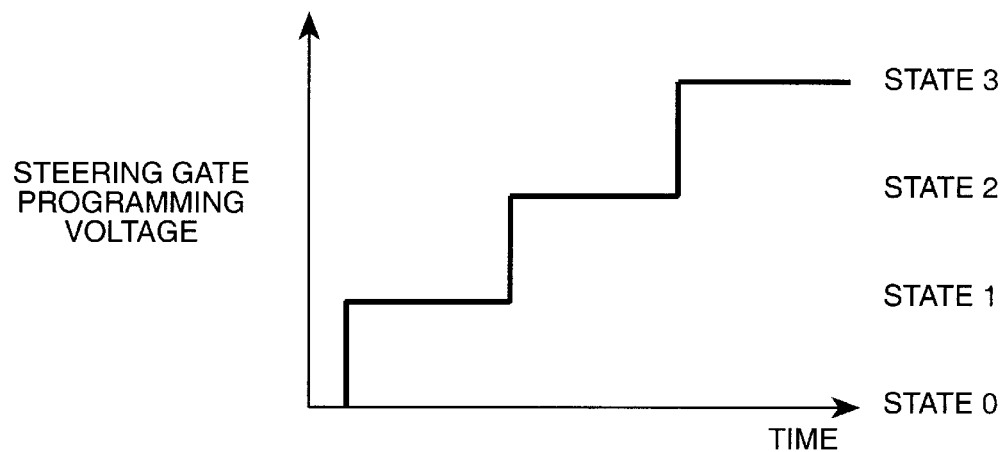
FIG._7

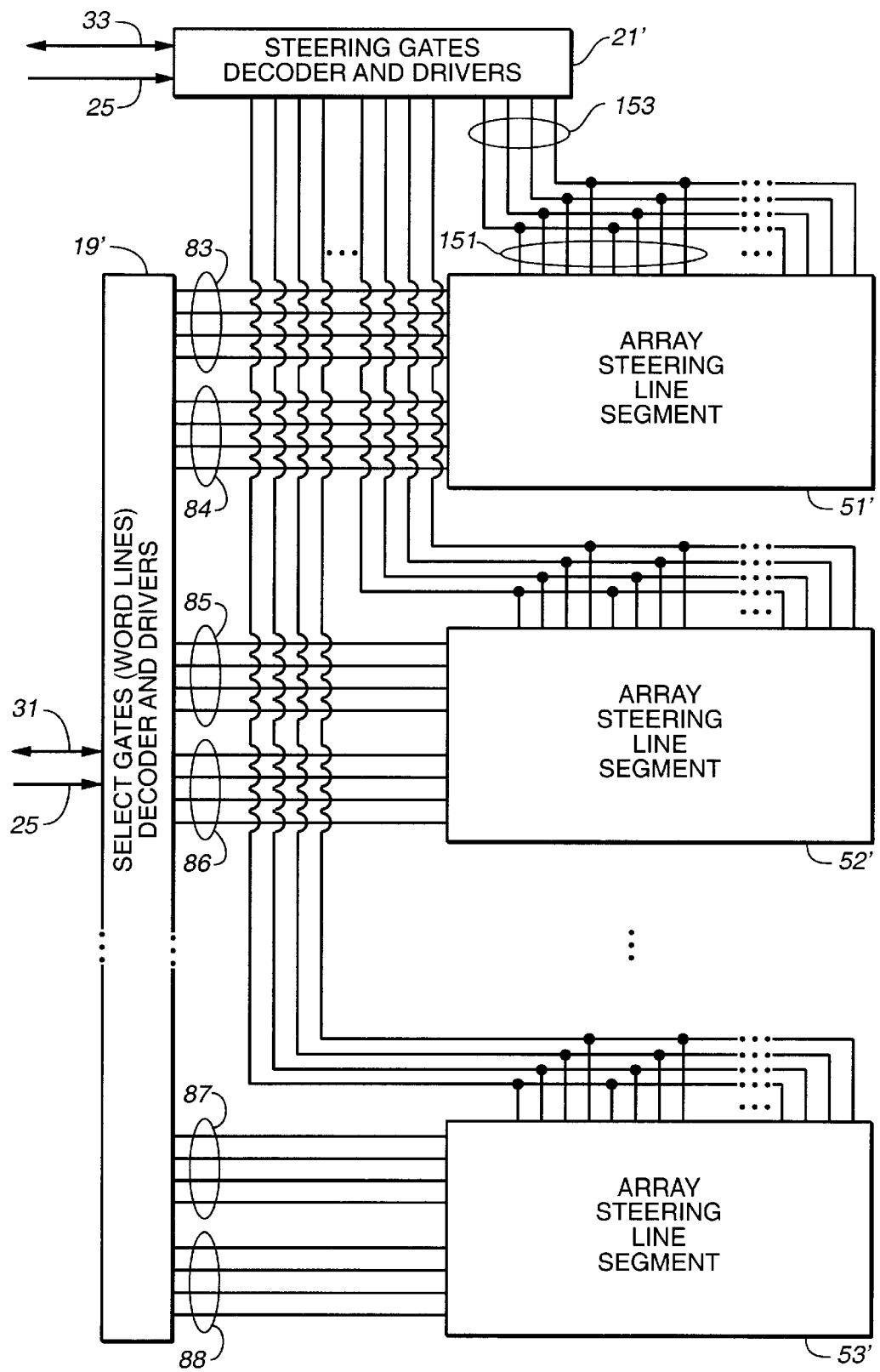
FIG._6

STEERING GATE AND BIT LINE SEGMENTATION IN NON-VOLATILE MEMORIES

BACKGROUND OF THE INVENTION

This invention relates generally to memory cell arrays, and, more specifically, to techniques of segmenting long conductive lines within the array and operating the array in segments. Although the invention has application to a wide variety of types of memory cell arrays, it is described herein to be implemented in a non-volatile memory, specifically a flash electrically-erasable and programmable read-only memory (flash EEPROM).

Memory cells of one type of array are arranged in a rectangular pattern with an individual cell being addressable by placing appropriate voltages on two perpendicular conductors that cross at the desired cell. These conductors are typically a word line which extends along a row of memory cells, and a bit line that extends along a column of memory cells. A first type of flash EEPROM architecture to be discussed herein uses cells that individually include a floating gate memory transistor and a select transistor in series between adjacent source and drain diffusions. The source and drain diffusions are connected to adjacent bit lines. Each word line is connected to control gates of the memory transistors and to gates of the select transistors of the cells along one row. Examples of the structures of such memory cells, and the architectures of memory arrays using them, are given in the following United States patents, which patents are incorporated herein in their entirety by this reference: U.S. Pat. Nos. 5,095,344, 5,343,063, 5,579,259 and 5,661,053. In these examples, a cell is programmed by injecting electrons onto its floating gate from the channel, and erased by removing electrons from the floating gate to a separate erase gate.

In order to have better control over the reading and programming functions, a second type of this form of memory electrically separates the control gate and the select transistor gate of each cell, connecting the control gates to added steering gate lines which run along columns of memory cells. In this form of memory, the word lines are connected only to the gates of the select transistors. This second type of memory cell is described, for example, in U.S. Pat. No. 5,313,421, which patent is incorporated herein in its entirety by this reference. The floating gates are erased to the word lines.

In order to increase the density of floating gates in the array, a third type of memory cell includes two floating gate transistors and a single select transistor in between them, the three transistors being positioned between adjacent source and drain diffusions. Steering gate lines extend over floating gates in the column direction, and word lines are connected to select transistor gates of memory cells along the rows. This type of cell is described in U.S. Pat. No. 5,712,180 (particularly FIGS. 9A through 10C thereof), U.S. Pat. Nos. 6,103,573 and 6,151,248, and pending application Ser. No. 09/667,344, filed Sep. 22, 2000, which patents and application are incorporated herein in their entirety by this reference.

In order to improve the performance of a large memory array, an array of one of the types identified above is typically segmented into smaller portions or sub-arrays in the direction of the columns. U.S. Pat. No. 5,315,541, which is incorporated herein in its entirety, divides the bit lines of a memory array of the first type identified above into electrically localized segments. The bit lines of each segment are connectable to global bit lines through segment-select transistors. FIG. 10C of aforementioned U.S. Pat. No. 5,712,180 and its accompanying text, describes a segmentation of the third type of memory identified above wherein both the columnar extending bit lines and steering gates are divided into equal segments. A primary motivation for segmenting a memory is to reduce the resistance and capacitance of a line whose voltage needs to be changed rapidly. This need has increased as the arrays have been made larger and more dense, and as the operating speeds have increased.

SUMMARY OF THE INVENTION

According to one aspect of the present invention, a memory array, such as the second or third type identified above, has both its steering gate lines and bit lines segmented in a columnar direction but the steering gate lines are divided into longer segments than the bit lines. More rows of memory cells are, therefore, included in one steering gate line segment than are included in one bit line segment. This is done to balance the advantages of short line segments with the disadvantages of added circuit area and other overhead that is consumed by segment-select transistors, one such transistor being required for connecting each line segment to a global version of that line. Because the voltage applied to the steering gates is higher than that applied to the bit lines, in general, the select transistors for the steering gate line segments are relatively large in circuit area while those for the bit line segments may be kept relatively small. Therefore, the balance of advantages and disadvantages is different for segmenting the steering gate lines and the bit lines. As a result, the bit lines are broken into shorter segments than the steering gate lines.

According to another aspect of the present invention, a memory array, such as the second or third type identified above, also has its steering gate lines divided into segments but rather than using select transistors to connect the lines of each segment to respective global lines, every Nth steering gate of each segment is connected together, and a resulting N number of electrically separate global steering gate lines of each segment are connected directly to the steering gate decoder. The number N depends on the specific memory, typically on how close floating gate storage elements being programmed at the same time in one row may be to each other without disturbing the charge on cells in that row that are not being programmed. N=4 is an example. In this way, the relatively large steering segment select transistors are eliminated. The steering gate decoder directly drives the correct steering gate line segments without increasing the complexity of the steering gate decoder. The bit lines may be segmented with the same segment lengths as the steering gates, or may be made different. Additional aspects, features and advantages of the present invention are included in the following description of its exemplary embodiments, which description should be taken in conjunction with the accompanying drawings.

BRIEF DESCRIPTION OF THE DRAWINGS

FIG. 1 is a block diagram of a flash EEPROM system in which the various aspects of the present invention may be implemented, as an example;

FIG. 2 illustrates the memory array of FIG. 1 that has been segmented according to a first example;

FIG. 3 is a circuit of a portion of the second type of memory cell array described in the Background, for use in the segments of FIGS. 2 and 6;

FIG. 4 is a circuit of a portion of the third type of memory cell array described in the Background, for use in the segments of FIGS. 2 and 6;

FIG. 5 illustrates one aspect of the programming of the memory cells of FIG. 3 or 4 when in the segments of FIG. 2;

FIG. 6 illustrates the memory array of FIG. 1 that has been segmented according to a second example; and FIG. 7 illustrates one aspect of the programming of the memory cells of FIG. 3 or 4 when in the segments of FIG. 6.

DESCRIPTION OF EXEMPLARY EMBODIMENTS

An example memory system that may utilize the various aspects of the present invention is generally illustrated in the block diagram of FIG. 1. A large number of individually addressable memory cells 11 are arranged in a regular array of rows and columns, although other physical arrangements of cells are certainly possible. Bit lines, designated herein to extend along columns of the array 11 of cells, are electrically connected with a bit line decoder and driver circuit 13 through lines 15. Word lines, which are designated in this description to extend along rows of the array 11 of cells, are electrically connected through lines 17 to a word line decoder and driver circuit 19. Steering gates, which extend along columns of memory cells in the array 11, are electrically connected to a steering gate decoder and driver circuit 21 through lines 23. Each of the decoders 13, 19 and 21 receives memory cell addresses over a bus 25 from a memory controller 27. The decoder and driving circuits are also connected to the controller 27 over respective control and status signal lines 29, 31 and 33. Voltages applied to the steering gates and bit lines are coordinated through a bus 22 that interconnects the decoder and driver circuits 13 and 21.

The controller 27 is connectable through lines 35 to a host device (not shown). The host may be a personal computer, notebook computer, digital camera, audio player, various other hand held electronic devices, and the like. The memory system of FIG. 1 will commonly be implemented in a card according to one of several existing physical and electrical standards, such as one from the PCMCIA, the CompactFlash Association, the MMCJ Association, the Secure Digital (SD) Card Association, and others. When in a card format, the lines 35 terminate in a connector on the card which interfaces with a complementary connector of the host device. The electrical interface of many cards follows the ATA standard, wherein the memory system appears to the host as if it was a magnetic disk drive. Other memory card interface standards also exist. Alternatively to the card format, memory systems of the type shown in FIG. 1 are embedded in the host device.

The decoder and driver circuits 13, 19 and 21 generate appropriate voltages in their respective lines of the array 11, as addressed over the bus 25, according to control signals in respective control and status lines 29, 31 and 33, to execute programming, reading and erasing functions. A plurality of sense amplifiers within the circuit 13 receive current or voltage levels that are indicative of the states of addressed memory cells within the array 11, and provides the controller 27 with information about those states over lines 41 during a read operation, optionally, in conjunction with steering gate driving levels of the circuit 21. A large number of sense amplifiers are preferably used in order to be able to read the states of a large number of memory cells in parallel. During reading and programming operations, one row of cells is typically addressed at a time, within a single array or sub-array, through the circuits 19 for accessing a number of cells in the addressed row that are selected by the circuits 13 and 21. During an erase operation, all cells in each of many rows are typically addressed together as a block for simultaneous erasure. Many variations of this structure and operation exist, however.

Referring to FIG. 2, a structure of the memory cell array 11 according to a first embodiment is shown. At least a portion of the total array is divided into a plurality of segments 51, 52, 53 etc. whose steering gates are each connectable to global steering gate lines 55–58 etc. from the decoder 21 through respective sets of switching transistors 61–64 etc., 67–70 etc., and 73–76 etc. Only four steering gate lines are shown to each of the segments 51, 52, 53, for simplicity, but hundreds or thousands of such lines are more typical, depending upon the type and number of memory cells in each row. Gates of each of these sets of switching transistors are connected together and through respective lines 77, 78, 79 etc. to an output of a decoder, shown in FIG. 2, for convenience, to be the decoder 21. Alternatively, in order to more efficiently lay out the system, the gate lines 77, 78, 79 etc. may be connected to a portion of the decoder 19 dedicated for that purpose. By applying the proper voltages to the gate lines 77, 78, 79 etc., the steering gates of only one segment at a time are connected to the global steering gate lines 55–58. This limits the length of the steering gate lines that are connected to the decoder output to one steering line segment, as compared to the full array, as would be the case without segmentation, thereby reducing the resistance and capacitance of the lines that are driven by the steering gate voltage drivers. A particular segment is selected when it contains memory cells to be programmed with data from the host, or with data to be read to the host. Cells within the selected segment are further addressed by the decoders 19 and 13 applying proper voltages on the word and bit lines.

Each of the segments 51, 52, 53 is shown in FIG. 2 to contain eight rows of memory cells, again for simplicity of illustration since something like 64, 128, 256 or more rows is more typical for each segment. Two groups 83 and 84 of four word lines each within the array segment 51 are connected to the decoder 19. Similarly, two groups 85 and 86 are part of the segment 52, and groups 87 and 88 part of the segment 53.

It is usually also desirable to segment the bit lines of the array 11 for the same reasons. But the number of rows included within each bit line segment need not be the same as the number in each of the steering gate line segments. Therefore, a bit line segmentation of the example of FIG. 2 is shown at the right side of the figure, for clarity of illustration. Two bit line segments are there shown to be within each steering gate line segment, each having four rows of memory cells in this simplified example. Array bit line segments 91 and 92 are part of the steering gate line segment 51, bit line segments 93 and 94 part of steering gate line segment 52, and bit line segments 95 and 96 are within the steering line segment 53. There can certainly be more than two bit line segments within each steering gate line segment of the array, for example four bit line segments, depending upon a number of factors. There can even be fewer bit line segments than steering gate line segments, where each bit line segment contains two or more steering gate line segments, but this is less likely to be useful, since bit lines, being the sensitive write/sensing nodes, benefit more from reduced parasitics of segmentation than do the forced steering lines.

Each of the bit line segments of FIG. 2 is connected through respective switching transistors to global bit lines 101, 102, 103, 104 etc. that originate from the decoder 13. Although only four bit lines are shown, for simplicity of explanation, many more than that are actually used, numbering into the hundreds and even the thousands. There is typically one bit line for each cell along the rows of the array. Switching transistors 107, 108, 109, 110, etc. connect the local bit lines of the segment 96 to the global bit lines 101, 102, 103, 104 when there gates are driven to the proper voltage by their common connection through a line 111 to the decoder 13. A similar switching transistor circuit is provided for each of the other bit line segments 91, 92 93, 94 and 95, as shown in FIG. 2. Typically, only one of the bit line segments is connected to the global bit lines at one time by the decoder 13 applying the proper voltages to the gate lines of the respective sets of switching transistors.

One reason for selecting different steering gate line and bit line segment sizes is because of the different dimensions required for the segment transistors of the steering gates and bit lines. This is because, typically, the steering gates and bit lines receive different maximum voltage levels during operation of the memory system. For example, steering gates in the type of flash EEPROM arrays being described can require up to 12 volts during programming, while the source and drain diffusions may require their associated bit lines to be raised to six volts during programming and one volt during reading. Therefore, the size of the individual switching transistors for the steering gate lines usually needs to be larger than those which connect with the bit lines. The memory system is designed by trading off the performance advantages that short lines resulting from many segments provide against the cost of the increased integrated circuit chip area that must be devoted to the increased number of associated switching transistors for an increased number of segments. When that area is large, fewer segments are usually employed. In the techniques being described, that compromise is made independently for the steering gate lines and for the bit lines. By needing greater area overhead for the steering gate segments than for the bit line segments, in the memory example being described, there can be more bit line segments, and thus shorter bit line lengths, than steering gate line segments.

FIGS. 3 and 4 are circuit diagrams of two alternative but related memory cell array circuits that can be employed in the array 11, and thus either one can appear within in the array segments of FIG. 2. The word lines, steering gate lines and bit lines labeled in FIGS. 3 and 4 are those which exit the line segment boxes of FIG. 2. FIG. 3 shows an example of an array of split channel cells that each has a single floating gate transistor and a select gate transistor. FIG. 4 shows an example of an array of memory cells that include two floating gate transistors separated by a select transistor. Further details of these types of arrays are given in the patents referenced in the Background section above for the second and third types of flash EEPROM arrays.

Briefly, with reference to FIG. 3, a single cell 115 is schematically shown with a memory transistor having a floating gate 116, and a steering gate 117 connected to a steering gate line 118. A select transistor includes a gate 119 connected to a word line 120. These two transistors are formed between adjacent source and drain regions 121 and 122 that are connected to bit lines 123 and 124, respectively. A proper voltage on the word line connects the cell 115 between the adjacent bit lines 123 and 124 for the purpose of programming or reading it.

Briefly, with reference to FIG. 4, a single cell 127 is described. Two memory transistors have respective floating gates 128 and 129, and respective steering gates 130 and 131. A select transistor in between them has a select transistor gate 132 connected to a word line 133. The memory cell transistors are formed between adjacent source and drain regions 134 and 135, which are connected to respective bit lines 136 and 137. The steering gates are connected to respective internal lines 138 and 139. But rather than connect each of these internal lines to the steering gate decoder, adjacent lines from adjacent cells are electrically connected together, as shown, to provide external steering gate lines 140 and 141 that are connected to the steering gate decoder. This reduces the complexity of the decoder without limiting operation of the array. Indeed, in one form of array, the two adjacent steering gate lines may be formed from a single strip of material that spans across two steering gates of adjacent cells.

The graph of FIG. 5 illustrates one way of programming the memory array of either of FIG. 3 or 4 when implemented as described with respect to FIG. 2. The voltage profile applied to a given steering gate line is dependent upon the data to be stored in a cell of an addressed row to which the steering gate line is connected. FIG. 5 provides an indication of the different profiles for a four state cell by showing an example of their relative beginning voltages. Since the voltage of each steering gate line is controllable independently of the other steering gate lines connected to other cells of the row being programmed, the voltage level of each steering gate line is controlled according to the ultimate state to which the cell connected to the steering line is being programmed. Four states 0–3 are shown in FIG. 5, but fewer or more states may be provided, more that two states being termed "multi-state."

A second embodiment of the present invention can be illustrated by reference to FIG. 6, wherein a steering gate decoder 21' and a select gate decoder 19' serve the same function as the respective decoders 21 and 19 of FIGS. 1 and 2 but differ somewhat because of differences in the way they interface with the memory cell array. The steering gate lines of the array are again segmented, forming segments 51', 52' , 53' etc. that are substantially identical to the segments 51, 52, 53 of FIG. 2, using either of the array circuit types of FIG. 3 or 4. The difference is in the way that the steering gate lines of the segments are connected to the decoder 21'.

Rather than providing for the connection of the external steering gate lines to a set of global lines, as is the case in the system of FIG. 2, the external steering gate lines are connected from the individual segments directly to the steering gate decoder 21' in FIG. 6, thus eliminating the need for the switching transistors of FIG. 2. But the connection of each external steering gate line from all the segments to the decoder 21' would require a decoder so large that it is impractical. Therefore, the external steering gate lines of each segment, such as illustrated with a few of the lines 151 from the segment 51', are connected together to form a fewer number of global lines 153 that are connected to the steering gate decoder 21'. In this specific example, every fourth steering gate line 151 is connected to a common one of the lines 153. So it does not matter how many columns, and thus steering gate lines, exist in the segments, since the number of global steering gate lines remains the same. More generally, when there are N number of lines 153 connected to the decoder 21', every Nth steering gate line 151 across the rows of the array is connected to a common one of the lines 153. The steering gate lines from each of the segments 51', 52', 53' etc. is connected to the decoder 21' in the same way.

This reduction of the number of lines is made possible when programming and reading functions, carried out in parallel on a number of floating gate storage elements that are spaced apart along a row of memory cells that is being accessed, apply common voltage conditions to the steering gates of all the spaced apart cells. It is normally desirable to minimize the number N of global steering lines used with a particular memory array. That minimum N depends upon the minimum spacing of memory cells along the rows that can be accessed at the same time for programming or reading. Typically, every fourth floating gate of the array of FIG. 3 may be accessed in parallel, for example, so it takes four such accesses, each with a different set of every fourth floating gate along the row, to perform the data programming or reading function on an entire row or contiguous segment of a row. During each of the four accesses, a different one of the lines 153 (FIG. 6) is enabled. If only every eighth floating gate may be simultaneously programmed or read, as another example, the number N of lines 153 becomes eight and every eighth one of the lines 151 is connected to a common one of the lines 153. The cells being programmed or read are spaced apart with one or several memory cells not being programmed or read being placed in between, as a way of minimizing pattern sensitive and/or disturb conditions. It is this consideration that influences the smallest N that may be employed in any specific memory arrangement.

If the dual floating gate memory cell array of FIG. 4 is used in the segments 51', 52', 53' etc. instead of the single floating gate memory cell of FIG. 3, and N remains four, one pair of adjacent steering gates out of every four such pairs is connected in parallel. This is because each external steering gate line is connected to steering gates overlying two columns of floating gates in adjacent columns of cells. This allows the spacing of storage elements (floating gates) along a selected row that may be simultaneously programmed to be one in eight (one cell in four), or as dense as one floating gate in four, depending upon how the other array elements are driven in the particular programming method being used. One such method that allows one in three floating gates to be simultaneously programmed, with N then equaling three, is described in a patent application entitled "Dual Cell Reading and Writing Technique," filed concurrently herewith, naming Raul-Adrian Cemea as inventor, and assigned Ser. No. 09/871,332. This application is incorporated herein in its entirety by this reference.

According to a typical operation of the memory of FIG. 6, the voltage applied to an individual steering gate during programming depends upon the data to be programmed onto the floating gate in its column. An example starting programming voltage for each of four states is illustrated in FIG. 7. Since this voltage cannot be set differently for each of the steering gates of the embodiment of FIG. 6, the voltage placed on the one global steering gate line 153 that is enabled for the programming of one set of cells is incremented through a profile that includes the starting voltage levels of each of the states. The cells to be programmed to state 1, for example, are disconnected from the process after they are so programmed by changing the voltage on the local bit lines connected to those cells. The remaining of the set of cells are programmed with the steering gate voltage at a level for state 2, with those programmed to that state being disconnected, and programming of the yet remaining of the set of cells continues with the steering gate voltage at a level for state 3, until all of the set of cells have been programmed.

For simplicity, the segmentation of the bit lines is not shown in FIG. 6. The bit lines may be segmented in the same manner as FIG. 2, where two or more bit line segments exist within each of the steering line segments. However, since the set of large sized switching transistors of FIG. 2 with each steering line segment are not required in FIG. 6, the number of rows in each steering line segment can be reduced. It is then a trade off between the improved performance that is obtained by smaller segments and the space and complexity of the decoder 21' to be able to decode addresses into a larger number of global steering gate lines. If the number of memory cell rows within each of the steering line segments becomes low enough to be the same as desired for each bit line segment, the two types of segments are made to be the same size in terms of the number of rows in each. The optimum size of the bit line segments is determined independently of the steering line segment size.

Although the invention has been described with respect to exemplary embodiments thereof, it will be understood that the invention is entitled to protection within the full scope of the appended claims.

It is claimed:

1. In an array of non-volatile memory cells oriented in rows and columns, including a first set of parallel conductive lines extending along columns of memory cells in contact with a first type of element thereof and a second set of parallel conductive lines extending along columns of memory cells in contact with a second type of element thereof, wherein the maximum voltage applied to the second set of lines is higher than the maximum voltage applied to the first set of lines, a method comprising:

operating the first set of lines in segments that individually extend across a first number of rows, individually connecting the segments of the first set of lines to a corresponding one of a first set of a plurality of global lines through a select transistor of a first size, operating the second set of lines in segments that individually extend across a second number of rows that is greater than the first number of rows, and individually connecting the segments of the second set of lines to a corresponding one of a second set of a plurality of global lines through a select transistor of a second size that is different than the first size.

2. The method of claim 1, wherein the segments of the second set of lines are individually connected to a corresponding one of a second set of plurality of global lines through a select transistor of a second size that is larger than the first size.

3. A data memory, comprising:

an array of non-volatile memory cells oriented in rows and columns, a first set of parallel conductive lines extending along columns of memory cells in contact with a first type of element thereof, said first set of lines being broken into segments that individually extend across a first number of rows of memory cells, a first set of global lines, a first plurality of switching transistors of a first size connected between individual ones of the first set of conductive line segments and corresponding ones of the first set of global lines, a second set of parallel conductive lines extending along columns of memory cells in contact with a second type of element thereof, said second set of lines being broken into segments that individually extend across a second number of rows of memory cells, said second number of rows being greater than the first number of rows, a second set of global lines, and a second plurality of switching transistors of a second size connected between individual ones of the second set of conductive line segments and corresponding ones of the second set of global lines, the second transistor size being larger than the first transistor size.

4. The memory of claim 3, wherein:

the memory cells individually include at least one floating gate positioned over a portion of a channel between adjacent source and drain diffusions, a steering gate positioned over the floating gate, and a select gate positioned over another portion of the channel, the first type of memory cell element includes the diffusions, wherein the first set of lines constitute bit lines, and the second type of memory cell element includes the steering gate, wherein the second set of lines constitutes steering gate lines.

5. The memory of claim 4, wherein the array rows of memory cells individually include a word line connected to the select gates of the memory cells in the row.

6. The memory of claim 4, wherein the memory cells individually include exactly two floating gates, a steering gate positioned over each of the floating gates and the select gate positioned between the two floating gates.

7. The memory of claim 3, where in the second number of rows includes an integer multiple of the first number of rows.

8. A data memory formed on a substrate, comprising:

a plurality of bit lines elongated in a column direction and spaced apart in a row direction, the columnar and row directions being orthogonal with each other, said bit lines being connected to source and drain regions formed in the substrate, an array of non-volatile memory cells oriented in rows and columns, wherein the cells individually include first and second memory transistors that each have a storage element positioned against adjacent source and drain diffusions, and a select transistor between the first and second memory transistors, a plurality of word lines elongated in a direction of the rows and spaced apart in a direction of the columns, each word line being connected to gates of the select transistors of the memory cells in one row, a plurality of steering gate lines elongated in a direction of the columns and spaced apart in a direction of the rows, the steering gate lines being connected with a column of steering gates of the memory cells that are positioned over the floating gates, means electrically separating the steering gate lines into segments which individually include a first number of rows for selectively connecting the steering gate lines of each segment to a corresponding set of global steering gate lines, means electrically separating the bit lines into segments which individually include a second number of rows for selectively connecting the bit lines of each segment to a corresponding set of global bit lines, and wherein two or more bit line segments occur within one steering gate line segment.

9. The memory of claim 8, wherein each of the steering gate selective connecting means and the bit line selective connecting means includes switching transistors for connecting each segment to a respective set of said global steering and global bit lines, and wherein the switching transistors of the steering gate selective connecting means are larger than those of the bit line selective connecting means in order to handle voltages of higher magnitude.

10. In an array of non-volatile memory cells oriented in rows and columns, including a first set of parallel conductive lines extending along columns of memory cells in contact with memory cell steering gates, a second set of parallel conductive lines extending along columns of memory cells in contact with memory cell source and drain regions, and a third set of parallel conductive lines extending along rows of memory cells in contact with select transistor gates thereof, a method comprising:

operating the first set of lines in a first set of segments that individually extend across a first number of rows, wherein every Nth of the first set of lines of each segment along the rows are connected together to a common global line, whereby N global lines are associated with each segment, and applying appropriate voltages to the global lines of one of the segments at a time as the result of decoding addresses directed to the memory array.

11. The method of claim 10, which additionally comprises:

operating the second set of lines in segments that individually extend across a second number of rows equal to the first number of rows, and individually connecting the segments of the second set of lines to a corresponding one of a second set of a plurality of global lines through a select transistor.

12. A data memory formed on a substrate, comprising:

a plurality of bit lines elongated in a column direction and spaced apart in a row direction, the columnar and row directions being orthogonal with each other, said bit lines being connected to source and drain regions formed in the substrate, an array of non-volatile memory cells oriented in rows and columns, wherein the cells individually include first and second memory transistors that each have a floating gate positioned against adjacent source and drain diffusions and a steering gate positioned over the floating gate, and a select transistor between the first and second memory transistors, a plurality of word lines elongated in the row direction and spaced apart in the column direction, each word line being connected to gates of the select transistors of the memory cells in one row, a plurality of steering gate lines elongated in the column direction and spaced apart in the row direction, each of the steering gate lines being connected with two adjacent columns of steering gates of adjacent memory cells, and wherein the steering gate lines are individually divided into a plurality of segments which span a first number of rows, every Nth of the steering gate lines of each segment, along the rows, being connectable together to a common global line, thereby forming N global lines for each segment that are connected directly with an address decoder.

13. The memory of claim 12, additionally comprising means electrically separating the bit lines into segments including a second number of rows for selectively connecting the bit lines of one such segment at a time to corresponding set of global bit lines.

14. The memory of claim 13, wherein the first and second number of rows are equal.

15. The memory of claim 12, wherein N equals four.

* * * * *